United States Patent
Brand et al.

(10) Patent No.: US 9,824,756 B2
(45) Date of Patent: Nov. 21, 2017

(54) MAPPING A LOOKUP TABLE TO PREFABRICATED TCAMS

(71) Applicant: GLOBALFOUNDRIES INC., Grand Cayman (KY)

(72) Inventors: Daniel Brand, Millwood, NY (US); Minsik Cho, Austin, TX (US); Ruchir Puri, Baldwin Place, NY (US); Andrew J. Sullivan, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1136 days.

(21) Appl. No.: 13/966,266

(22) Filed: Aug. 13, 2013

(65) Prior Publication Data

US 2015/0052298 A1    Feb. 19, 2015

(51) Int. Cl.
*G11C 15/04* (2006.01)
*G11C 15/00* (2006.01)

(52) U.S. Cl.
CPC .............. *G11C 15/04* (2013.01); *G11C 15/00* (2013.01)

(58) Field of Classification Search
CPC ................................ G11C 15/00; G11C 15/04
See application file for complete search history.

(56) References Cited

U.S. PATENT DOCUMENTS

| | | | |
|---|---|---|---|
| 6,900,999 B1 | 5/2005 | Yen | |
| 7,082,044 B2 | 7/2006 | Gould | |
| 7,274,581 B1 | 9/2007 | Powell | |
| 7,356,033 B2 | 4/2008 | Basu | |
| 8,205,040 B1 * | 6/2012 | Mahamuni | G06F 13/28 365/49.17 |
| 8,924,640 B2 * | 12/2014 | Koktan | H04L 45/7457 711/108 |
| 2005/0102428 A1 * | 5/2005 | Heintze | H04L 69/12 711/108 |
| 2008/0080539 A1 * | 4/2008 | Hong | H04L 45/7453 370/402 |
| 2012/0140540 A1 | 6/2012 | Agam | |

OTHER PUBLICATIONS

Rottenstreich et al., "Worst-Case TCAM Rule Expansion," Proceedings IEEE INFOCOM 2010 (Background).

(Continued)

*Primary Examiner* — Aracelis Ruiz
(74) *Attorney, Agent, or Firm* — Anthony Canale; Andrew M. Calderon; Roberts Mlotkowski Safran Cole & Calderon, P.C.

(57) ABSTRACT

Access is obtained to a truth table having a plurality of rows, each including a plurality of input bits and a plurality of output bits. At least some rows include don't-care inputs. At least some of the rows are clustered into a plurality of multi-row clusters. At least some of the multi-row clusters are assigned to ternary content-addressable memory modules of a prefabricated programmable memory array. Instructions for interconnecting the ternary content-addressable memory modules with a plurality of input pins of the prefabricated programmable memory array and a plurality of output pins of the prefabricated programmable memory array are specified in a data structure, in order to implement the truth table.

14 Claims, 9 Drawing Sheets

(56) References Cited

OTHER PUBLICATIONS

Qin et al., "Implementation of LPM Address Generators on FPGAs," Reconfigurable Computing: Architectures and . . . , 2006—Springer (Related).

Huang et al., ""Green" Micro-Architecture and Circuit Co-Design for Ternary Content Addressable Memory," Circuits and Systems, 2008. ISCAS 2008. IEEE International Symposium on (Background).

Spitnagel et al., "Packet Classification Using Extended TCAMs," Proceedings of the 11th IEEE International Conference on Network Protocols 2003 (ICNP'03) (Related).

Zhang et al., "An Efficient Parallel TCAM Scheme for the Forwarding Engine of the Next-generation Router," 12th IFIP/IEEE 1M 2011: Mini Conference (Background).

Basci et al., "Statistically Partitioned, Low power TCAM," Circuits and Systems, 2004. NEWCAS 2004. The 2nd Annual IEEE Northeast Workshop on (Background).

Wikipedia, Bipartite graph, downloaded from http://en.wikipedia.org/wiki/Bipartite_graph, Aug. 1, 2013.

Wikipedia, Content-addressable memory, downloaded from http://en.wikipedia.org/wiki/Content-addressable_memory Jul. 12, 2013.

Wikipedia, Field-programmable gate array, downloaded from http://en.wikipedia.org/wiki/Field-programmable_gate_array Jul. 12, 2013.

Wikipedia, Flash memory, downloaded from http://en.wikipedia.org/wiki/Flash_memory Jul. 12, 2013.

Wikipedia, Hamming distance, downloaded from http://en.wikipedia.org/wiki/Hamming_distance Jul. 18, 2013.

Wikipedia, Hardware description language, downloaded from http://en.wikipedia.org/wiki/Hardware_description_language Jul. 12, 2013.

Bill Jason P. Tomas, Introduction to Field Programmable Gate Arrays (FPGAS), Dept. of Electrical and Computer Engineering University of Nevada Las Vegas, downloaded from http://www.ee.unlv.edu/~yingtao/2012_Spring/ECE720/studen%20presentations/Introduction_to_Field_Programmable_Gate_Arrays.pptx Jul. 25, 2013.

Anon., Lecture 16, Network Flow I, downloaded from http://www.cs.cmu.edu/~avrim/451f11/lectures/lect1025.pdf Aug. 1, 2013.

Wikipedia, Magnetoresistive random-access memory, downloaded from http://en.wikipedia.org/wiki/MRAM Jul. 12, 2013.

Wikipedia, Phase-change memory, downloaded from http://en.wikipedia.org/wiki/Phase-change_RAM Jul. 12, 2013.

* cited by examiner

MAPPING A LOOKUP TABLE TO PREFABRICATED TCAMS

STATEMENT OF GOVERNMENT RIGHTS

Not Applicable.

CROSS-REFERENCE TO RELATED APPLICATIONS

Not Applicable.

FIELD OF THE INVENTION

The present invention relates to the electrical, electronic and computer arts, and, more particularly, to design automation and the like.

BACKGROUND OF THE INVENTION

In standard computer memory (random access memory or RAM), the user supplies a memory address and the RAM returns the data word stored at that address. In content-addressable memory, or CAM, the user supplies a data word and the CAM searches its entire memory to see if that data word is stored anywhere therein. If so, the CAM returns a list of the storage address(es) where the word was found (and in some architectures, it also returns the data word, or other associated pieces of data).

Binary CAM is the simplest type of CAM; it employs data search words including only ones and zeroes. Ternary CAM (TCAM) allows a third matching state of "don't care" for one or more bits.

SUMMARY OF THE INVENTION

Principles of the invention provide techniques for mapping a lookup table to prefabricated TCAMS. In one aspect, a prefabricated programmable memory array includes a plurality of ternary content-addressable memory modules; at least one memory module of a type other than ternary content-addressable memory; a plurality of input ports; a plurality of output ports; a reconfigurable input logic fabric programmable to selectively interconnect the plurality of input ports with the plurality of ternary content-addressable memory modules and the at least one memory module of the type other than ternary content-addressable memory; and a reconfigurable output logic fabric programmable to selectively interconnect the plurality of output ports with the plurality of ternary content-addressable memory modules and the at least one memory module of the type other than ternary content-addressable memory.

In another aspect, an exemplary method includes the step of obtaining access to a truth table having a plurality of rows, each of the rows including a plurality of input bits and a plurality of output bits, at least some of the rows including don't-care inputs; clustering at least some of the rows into a plurality of multi-row clusters; assigning at least some of the multi-row clusters to ternary content-addressable memory modules of a prefabricated programmable memory array; and specifying in a data structure instructions for interconnecting the ternary content-addressable memory modules with a plurality of input pins of the prefabricated programmable memory array and a plurality of output pins of the prefabricated programmable memory array, in order to implement the truth table.

In still another aspect, a design structure is provided. The design structure is readable by a machine used in design, manufacture, or simulation of an integrated circuit. The design structure includes the elements of the prefabricated programmable memory array and/or instructions to program such array.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

Building a lookup table for complex functionality will enhance system performance such as Fast Fourier Transform (FFT), Viterbi decoder Memory-lookup method for computing can consume less power than custom-ASIC or FPGA style implementations Memory technology has been providing robustness with Error Correction Code (ECC), Parity and so on. Hence, the computing with memory-lookup can be more robust against any kind of errors Memory cost is very low, and expected to decrease in the future, which allows building less expensive computing systems These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
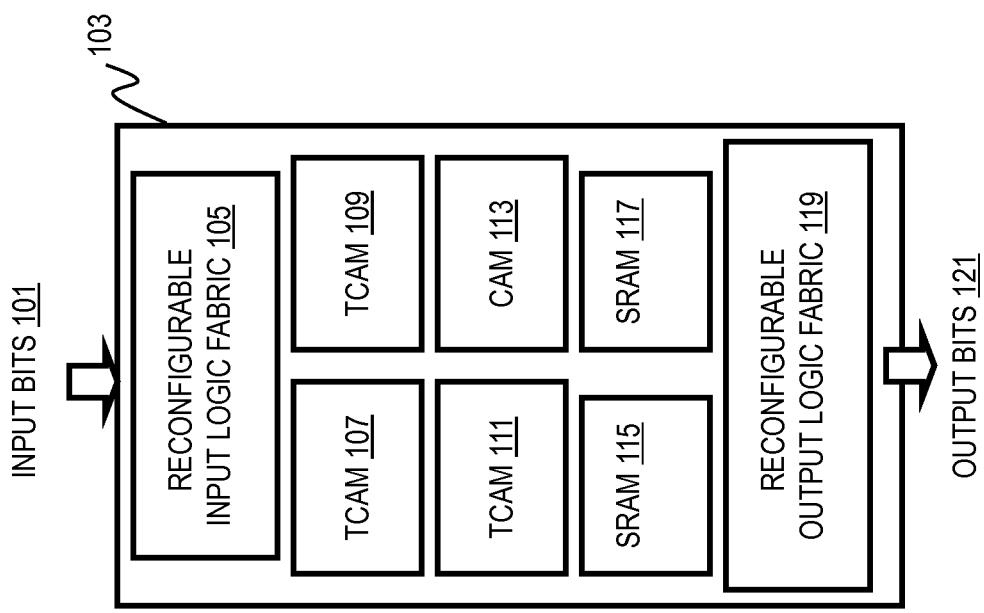
FIG. 1 shows a reconfigurable memory fabric, in accordance with an aspect of the invention.

FIG. 1 shows a reconfigurable memory fabric 103, in accordance with an aspect of the invention. Fabric 103 includes various pre-fabricated memories exhibiting the behavior of TCAMs 107, 109, 111; CAMs 113; and SRAMs 115, 117. Other embodiments may have different numbers of each type. Different technologies can be used to implement each type of memory; for example, complementary metal-oxide semiconductor (CMOS), Flash, phase-change memory (PRAM), magnetoresistive random-access memory (MRAM), and the like. The fabric can be implemented as standalone hardware in the style of an application-specific integrated circuit (ASIC), as extra resources in the style of a field-programmable gate array (FPGA), and so on. In at least some embodiments, the reconfigurable IO logic 105, 119 is implemented using FPGA techniques.

In one or more embodiments, everything is reconfigurable; the memories 107, 109, 111, 113, 115, 117; and the IO logic 105, 119. Input logic 103 is typically mostly wiring with fan-out from the input ports having input bits 101, while output logic 119 is typically mostly OR-ing with fan-in to the output ports having output bits 121.

One or more embodiments provide a synthesis flow to map a function to memory and accordingly IO fabrics 105, 119. One or more embodiments provide a reconfigurable memory fabric for memory-based computing and/or a method to map a given function (in HDL) to a given reconfigurable memory fabric 103.

Figure 2:
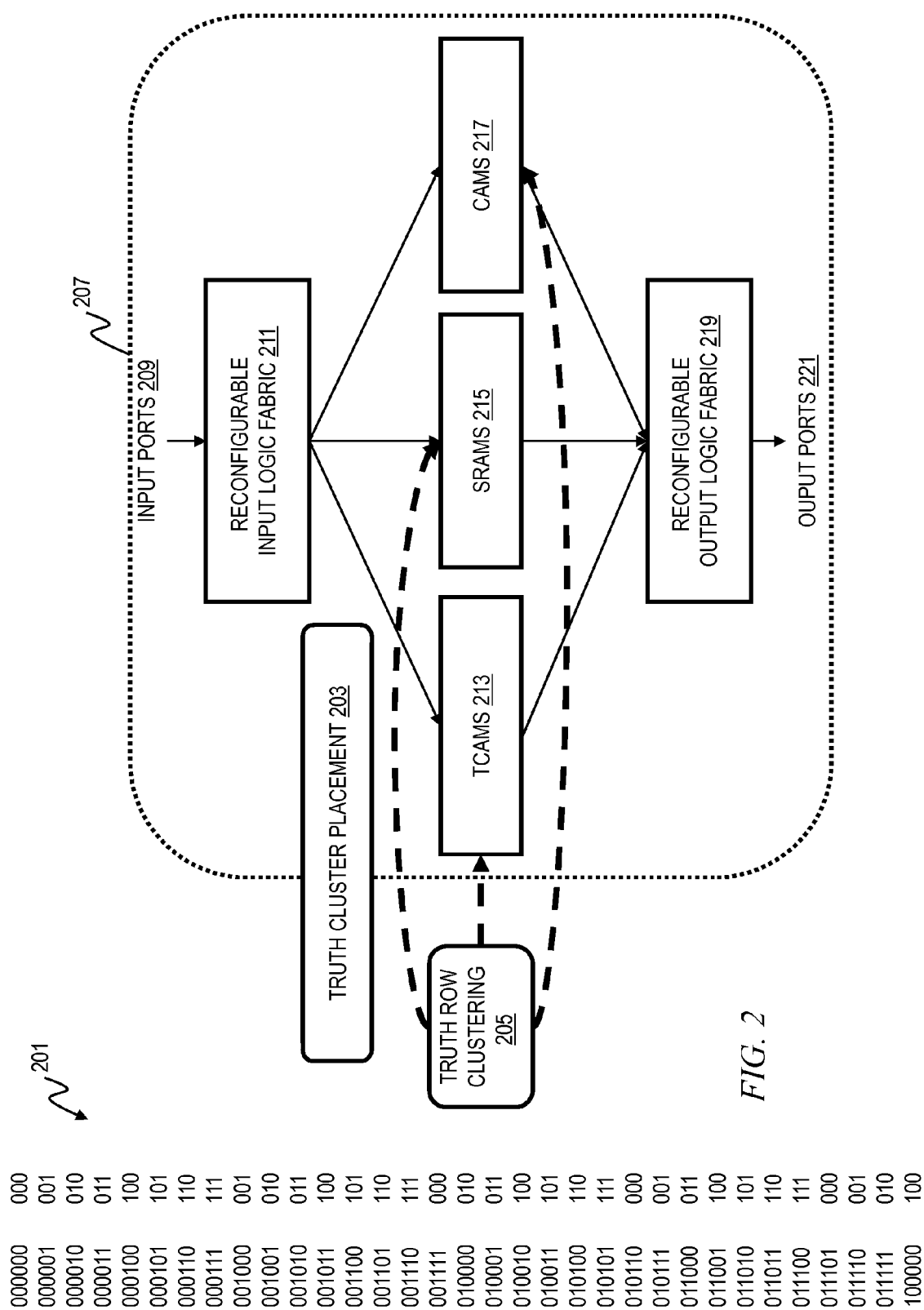
FIG. 2 shows an overview of truth cluster placement in a reconfigurable memory fabric, in accordance with an aspect of the invention.

FIG. 2 shows an overview of truth cluster placement 203 in a reconfigurable memory fabric 207 (for example, such as fabric 103 of FIG. 1), in accordance with an aspect of the invention. Truth table 201 is discussed further below. Input ports 209 of reconfigurable input logic fabric 211 have input bits such as 101 in FIG. 1. Fabric 211 is, for example, similar to fabric 105 in FIG. 1. TCAMs 213, SRAMs 215, and CAMs 217 are similar to corresponding elements 107, 109, 111; 115, 117; and 113 in FIG. 1, for example. Output ports 221 of reconfigurable output logic fabric 219 have output bits such as 121 in FIG. 1. Once truth table 201 is optimized as discussed below, it is desired to carry out clustering 205.

As noted, in CAM, instead of providing an address and retrieving data at that address, given data, the CAM determines all addresses where that data is stored. CAM is advantageous, for example, for routers and the like. As also noted, TCAM adds "don't cares" (signified by a dash "-" instead of one "1" or zero "0" in the truth tables in the figures; truth table 201 does not show don't cares; this is discussed further below). In one or more embodiments, given a truth table, with a significant number of don't cares, it is desired to store the truth table in CAM, TCAM, or SRAM, in a manner that is efficient in terms of power and speed. Furthermore in this regard, in one or more embodiments, instead of carrying out a linear computation using logic gates, undertake a look-up using memory. This is useful, for example, in evaluating complex functions. Look-up tables such as table 201 may be quite large. Different types of memory are available on fabric 207; e.g., TCAMs 213, SRAMs 215, and CAMs 217. It is desired to efficiently store the truth table 201 in the memory modules (e.g., TCAMs 213, SRAMs 215, and CAMs 217). As discussed further below, in one or more embodiments, compress the truth table 201; in some cases, as much as possible. One or more embodiments take advantage of don't cares to minimize memory capacity requirements. TCAM is useful because it can understand don't-cares; however, it is typically expensive as compared to CAM and SRAM. At least some prefabricated circuits have fixed numbers of TCAMS available. As shown at 205, one or more embodiments cluster rows of the table 201 in an appropriate manner to achieve the desired efficient storage of the truth table 201 in the memory modules. One or more embodiments provide a method to build an arbitrary function on pre-fabricated memory elements.

Figure 3:
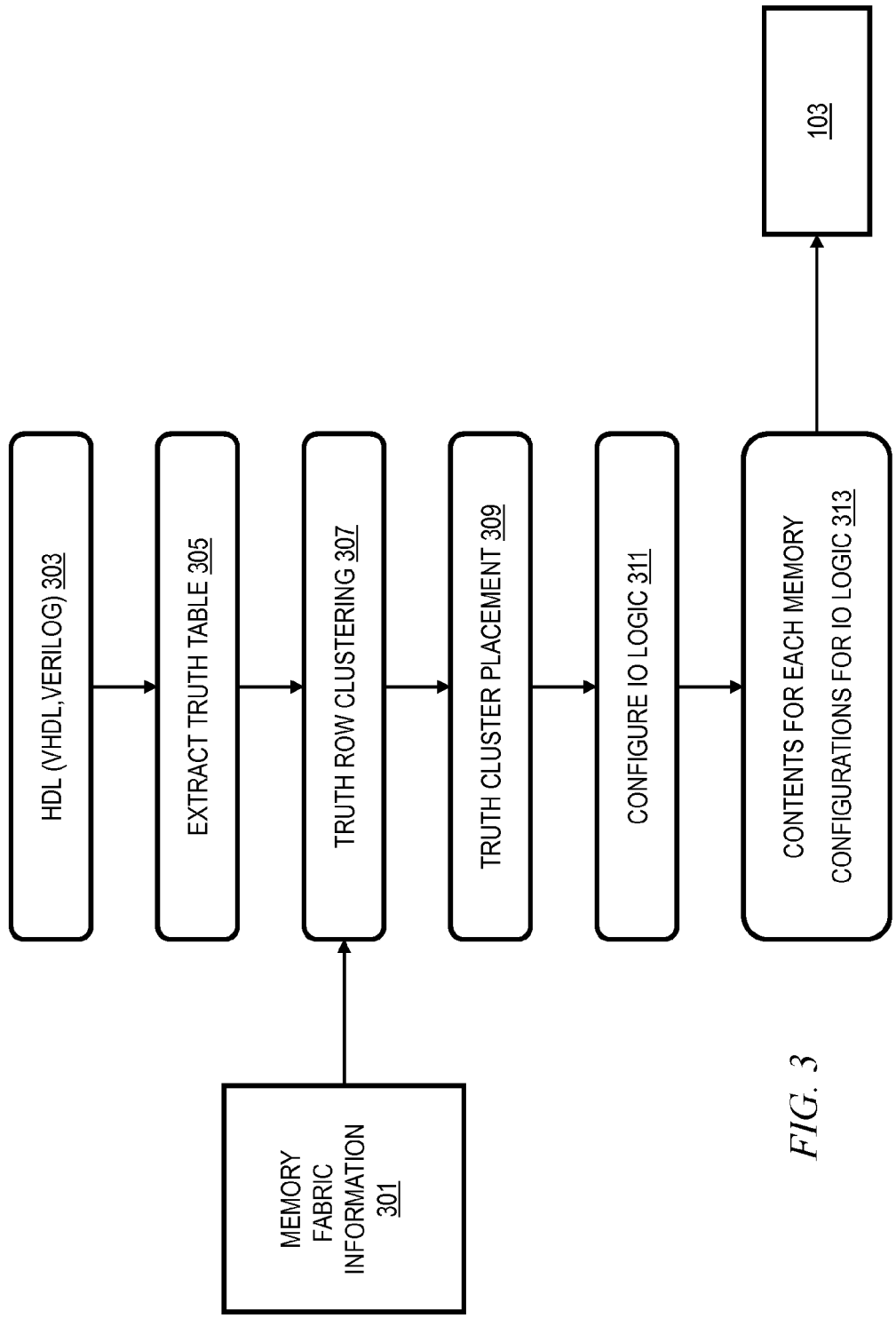
FIG. 3 shows a flow chart of an exemplary method, in accordance with an aspect of the invention.

FIG. 3 shows a flow chart of an exemplary method, in accordance with an aspect of the invention. Begin with a design expressed in a hardware description language (HDL) such as VHDL or Verilog, as shown at 303. In step 305, extract the truth table from the design. Extracting the truth table from logic can be done, for example, using one of the following two ways:

1) for a given output bit, backtrace the input that can produce "1" on this output. For example, suppose there is a two-input AND gate right before the port. Then, it is known that the input values must be (1, 1) so as to have 1 on the output, and thus on the port. Then, recursively applying the same idea on these two inputs, eventually reach the input ports with the value(s) that drive(s) 1 on the initial output port 2) Alternatively, if logic is not large, exercise the VHDL (or logic) with all possible input combinations.

In step 307, based on information 301 about the memory fabric (e.g., 103, 207), carry out truth row clustering, as will be described in greater detail below, and as alluded to at 205 in FIG. 2. In step 309, carry out truth cluster placement, as will be described in greater detail below, and as alluded to at 203 in FIG. 2. In step 311, configure the input logic 105, 211 and output logic 119, 219 to properly couple the respective input and output ports to the different memory elements on the fabric. Finally, as shown at 313, program the fabric 103 so that each memory element 107, 109, 111, 113, 115, 117 has the proper contents and so that the input and output fabrics 105, 119 have the proper configurations.

Figure 4:
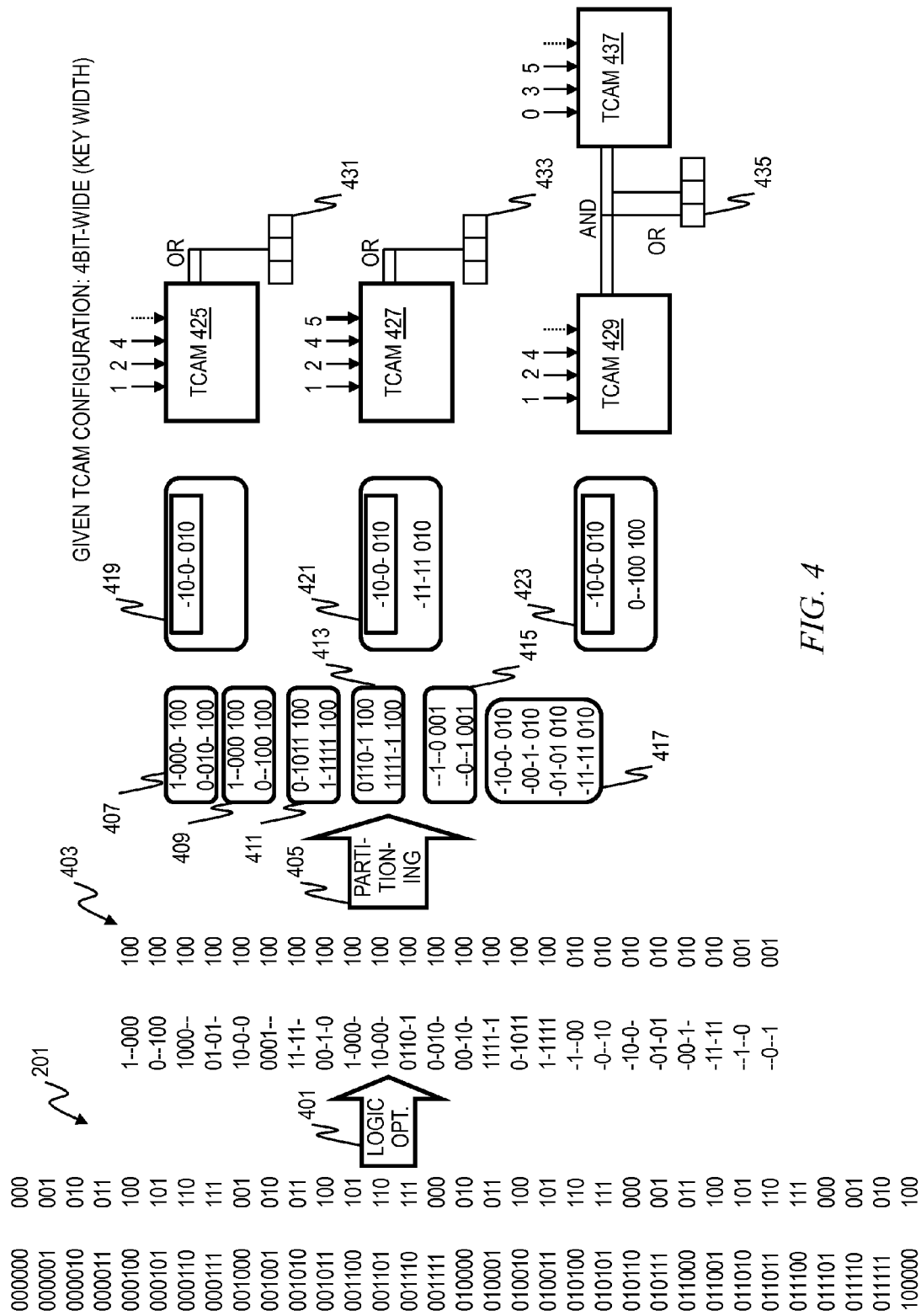
FIG. 4 shows an input sharing clustering technique, in accordance with an aspect of the invention.

FIG. 4 shows an input sharing clustering technique, in accordance with an aspect of the invention. Truth table 201 includes all zeroes and ones; i.e., advantage has not yet been taken of possible "don't cares." For example, in the first line of table 201, input of six bits, all zeroes, results in an output of three bits, all zeroes. In the second line of table 201, input of zeroes in the first five most significant bits and one in the least significant bit results in an output of zero, zero, one. In general, the first column shows the six input bits and the second column the three output bits. Then, a logic optimization process 401 is carried out to take advantage of "don't cares" and resulting in optimized truth table 403. More specifically, as reflected in the first line of table 403, it is observed in table 201 that all inputs with a one in the most significant bit and zeroes in the three least significant bits map to an output of "100" regardless of the values of the second and third bits from the left of the input. Those bits are then replaced with "don't cares" "-" to simplify to 1 - - 0 0 0. This allows reducing the 33 rows of table 201 to the 24 rows of table 403.

Next, carry out partitioning, as shown at 405, to obtain partitions such as 407, 409, 411, 413, 415, and 417. Each partition has similar inputs and/or outputs. Similar input don't-cares save memory, while similar outputs save output logic complexity. In the example of FIG. 4, partitions 407, 409, 411, and 413 have the same output 100; partition 415 has the same output 001, and partition 417 has the same output 010. Furthermore, in the example of FIG. 4, consider a TCAM 425 with a 4-bit (input) width. The three output bits are shown at 431; the output makes use of a single OR gate (not separately numbered). The partition 419 has input - 1 0 - 0- and output 010. Bits 1, 2, and 4 are applied to the first three inputs, since bits 0, 3, and 5 are don't cares. In general, if there are five input bits, two TCAMS will be needed. In the case shown at 421, 427, 433 in FIG. 4, the location of the don't cares in the inputs is close, as seen at 421. Therefore, only four input bits are needed, and a single TCAM 427, shown with its output bits 433 and OR gate, can be employed. Specifically, only bits 1, 2, 4, and 5 need to be input to TCAM 427, since input bits 0 and 3 are don't cares in both rows. In the case shown at 423, 429, 435, 437 in FIG. 4, there are no common don't cares, as seen at 423, so two TCAMs 429, 437 are needed. An AND gate and an OR gate are needed to obtain output bits 435. Input bits 1, 2, and 4 are applied to TCAM 429 and input bits 0, 3, and 5 are applied to TCAM 437.

It will be appreciated that the case shown at 421, 427, 433 in FIG. 4 is a better choice than the case shown at 423, 429, 435, 437 in FIG. 4, because only a single TCAM 427 with an OR gate at the output is required in the former case, whereas in the latter case, two TCAMS 429, 437, an AND gate, and an OR gate are needed. One or more embodiments seek to partition so as to group similar don't cares and similar outputs.

Figure 5:
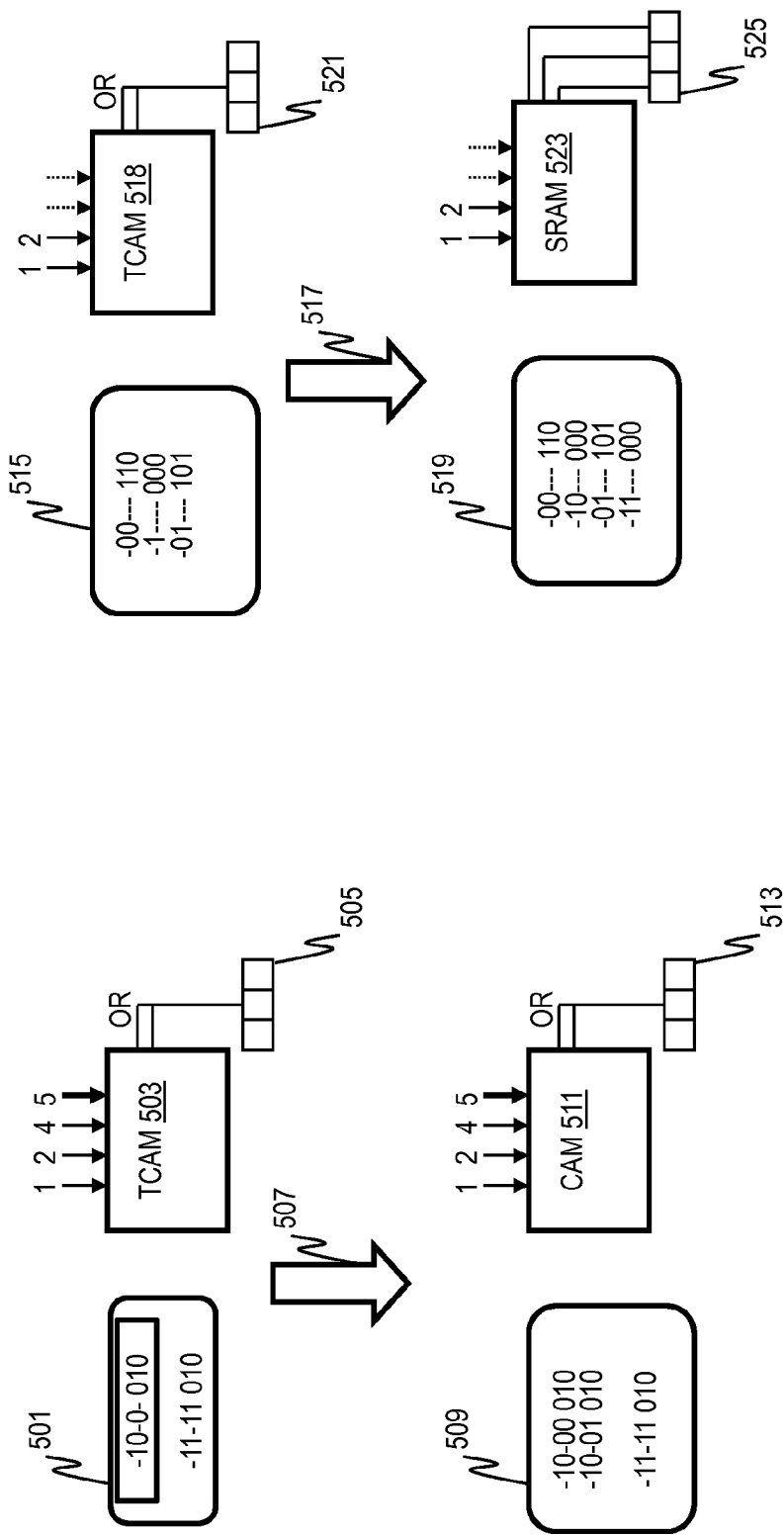
FIG. 5 shows a don't-care expanding clustering technique, in accordance with an aspect of the invention.

FIG. 5 shows a don't-care expanding clustering technique, in accordance with an aspect of the invention. In this regard, TCAMS are typically more expensive than CAMS, and CAMS are typically more expensive than SRAMS. At the left-hand side of FIG. 5, note partition 501, and TCAM 503 with output bits 505 using an OR gate. As indicated by the arrow 507, expand the don't cares in line one of partition 501, as at 509, and use a CAM 511 instead; CAM 511 is shown with its output bits 513 and OR gate. Thus, in one or more embodiments, when no don't cares are present, use cheaper memory such as CAM instead of TCAM. By expanding, the fifth bit at 509 does not require a don't care as it does at 501.

At the right-hand side of FIG. 5, note partition 515, and TCAM 518 with output bits 521 using an OR gate. As indicated by the arrow 517, expand the second don't-care in the second line of 515, and obtain a "nice" pattern 519 that can be translated to SRAM 523, shown with its output bits 525.

Figure 6:
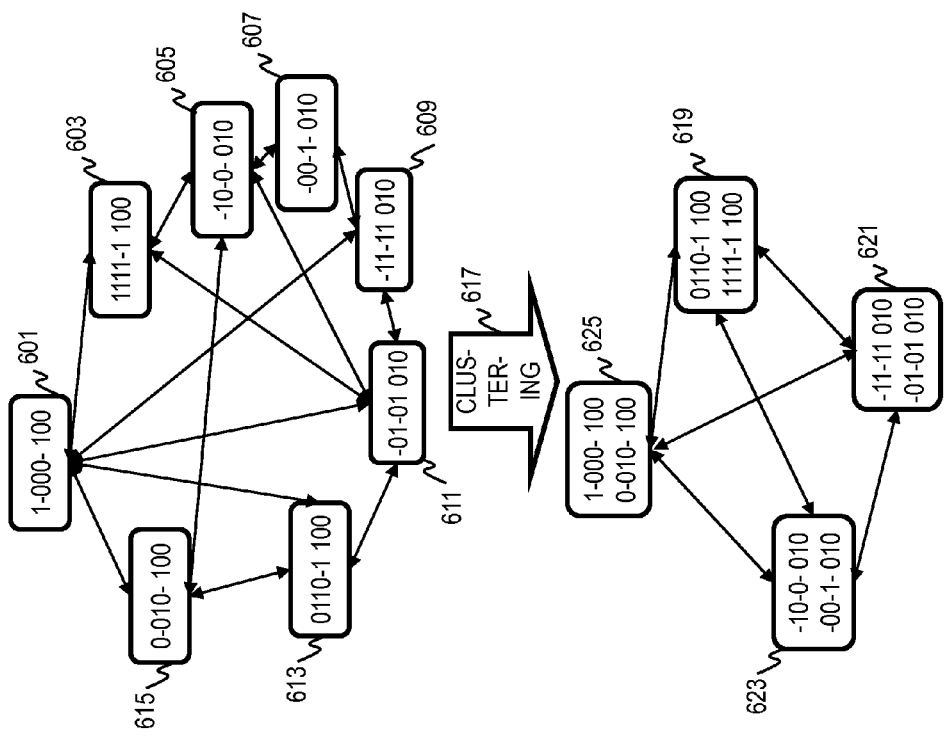
FIG. 6 shows a graph node clustering technique, in accordance with an aspect of the invention.

FIG. 6 shows a graph node clustering technique, in accordance with an aspect of the invention. In a first step, create a graph wherein each node has one row from the table (e.g., table 403). Here, the nodes are 601, 603, 605, 607, 609, 611, 613, and 615. Each node has an input dependency pattern (IDP): 0-010-=>10110. Furthermore in this regard, IDP indicates whether an N-th input is needed for TCAM. For 0-010-, it can be seen that the $2^{nd}$ and $6^{th}$ bits are not needed (second and sixth starting with one or first and fifth starting with zero), as they are "don't care," yet the others bits are needed. Thus, "-" becomes zero (no use) and 0 or 1 become "1" as that bit is needed.

Once two bit sequences from the truth table and the corresponding IDPs are available, the "closeness" of the two bit sequences can be determined by computing the hamming distance between IDPs. The hamming distance becomes the cost during the clustering, and in one or more embodiments, it is desired to minimize it.

Each node has a TCAM type. That is to say, in the beginning, it is not yet known whether TCAM, CAM, or SRAM is required; all that is known is that there is some don't-care that it is desired to take advantage of. Since TCAM is the most generic storage type, assume initially that only TCAM will be used, which leads to the assumption that each node is a TCAM type. During the clustering process, if an opportunity based on don't-care expanding is found, one or more embodiments "degenerate" the TCAM into CAM, SRAM types for some node(s). Once a node is degenerated it will affect clustering: clustering can be done for the same node types (e.g., no clustering between SRAM and TCAM).

The edge cost will be high if merging two nodes requires memory cascading, and, furthermore, the edge cost is a function of the Hamming distance between two IDPs and the Hamming distance between outputs. The Hamming distance between two strings of equal length is the number of positions at which the corresponding symbols are different.

In a second step, merge two nodes in the graph. The nodes to be merged should be connected by the minimal cost edge, there should be no overflows in the memory capacity after merging, and the two nodes to be merged should be the same memory type.

In a third step, continue merging unless the memory capacity has been used up.

In a fourth step, after the merge, update the IDP for each node and the edge cost.

Exit when no more clustering is possible and the entire truth table fits in the targeted device; otherwise, go back to the second step and repeat for additional merges.

The resulting merged nodes are shown at 619, 621, 623, and 625.

Thus, represent each line in the truth table as a graph node. Make a complete graph. The graph has a cost, measured by similarity. If close, cost is a low number; if different, cost is a higher number. Cluster so as to minimize overall cost.

Figure 7:
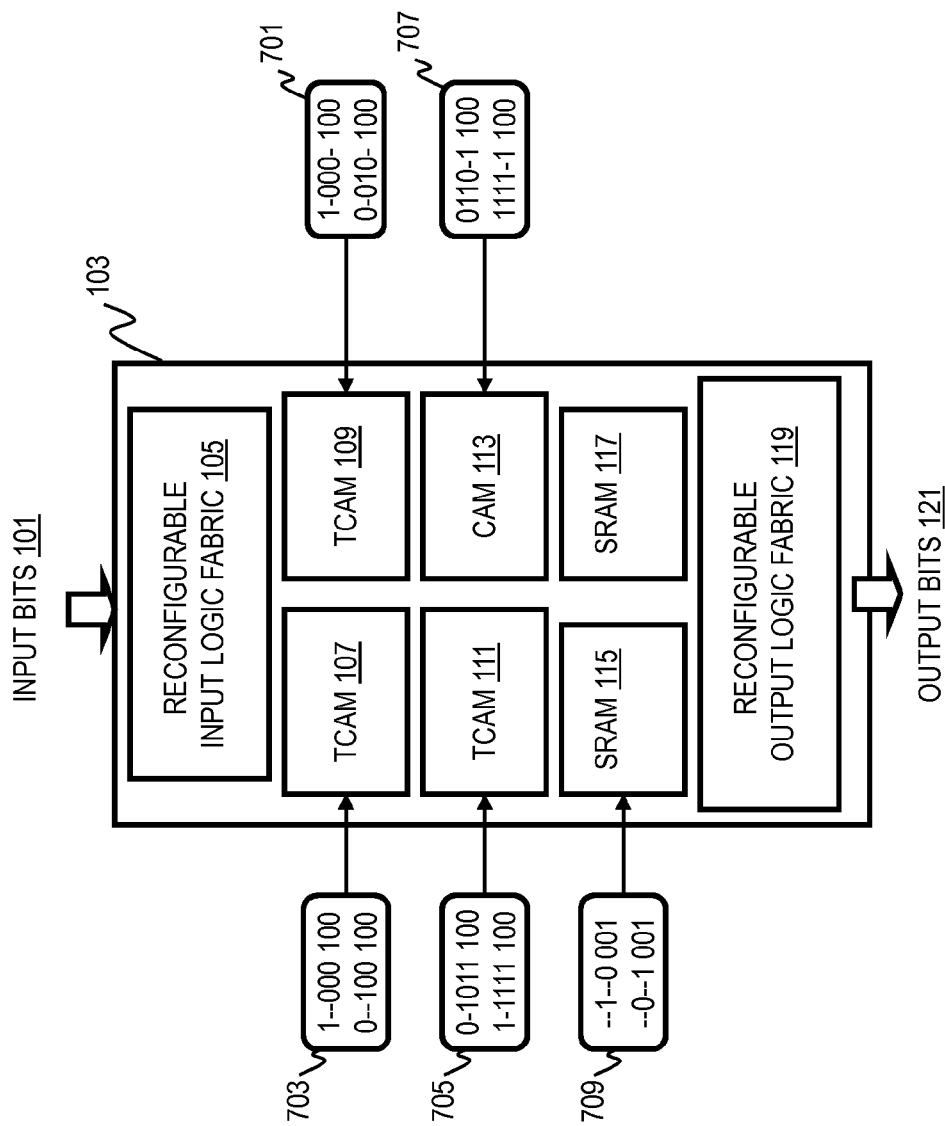
FIG. 7 shows a cluster placement technique, in accordance with an aspect of the invention.

FIG. 7 shows a cluster placement technique, in accordance with an aspect of the invention—i.e., how to place clusters—assign to TCAM 107, 109, 111; CAM 113; or SRAM 115, 117. When mapping clusters into TCAMS it is desirable for the TCAMs to be close to each other, so as to minimize signal-propagation delay; this is a form of timing-driven placement. See, e.g., TCAMs 429, 437 in FIG. 4—in such a design, the two TCAMs should be closely placed. In FIG. 7 note clusters 701, 703, 705, 707, and 709. These are to be mapped to the memory elements in the fabric 103 of FIG. 1. Each cluster is small enough to fit to any memory of a given type (TCAM, CAM, and SRAM). With regard to timing-driven placement, as noted, cascaded clusters should be closer. Clusters for TCAMs should be located on the faster path between input 101 and output 121, since TCAM is slower than CAM and SRAM. Clusters with higher input dependency should also be located on the faster path between input 101 and output 121.

To meet the desired placement goals, the solution can be approached as an assignment problem using, e.g., network-flow or bipartite graph matching. The skilled artisan will be familiar with network-flow and bipartite graph matching per se, and, given the teachings herein, will be able to employ same to implement one or more embodiments. Furthermore in this regard, in the network flow problem, given a directed graph G, a start node s, and a sink node t, each edge e in G has an associated non-negative capacity c(e), where for all non-edges it is implicitly assumed that the capacity is 0. The goal is to push as much flow as possible from s to t in the graph. The rules are that no edge can have flow exceeding its capacity, and for any vertex except for s and t, the flow in to the vertex must equal the flow out from the vertex. That is, the capacity constraint requires that on any edge e f(e)≤c(e), and flow conservation requires that for any vertex v other than s and t, flow in equals flow out. Subject to these constraints, it is desired to maximize the total flow into t. In the mathematical field of graph theory, a bipartite graph (or bigraph) is a graph whose vertices can be divided into two disjoint sets U and V such that every edge connects a vertex in U to one in V; that is, U and V are each independent sets. A matching in such a graph is a subset of its edges, no two of which share an endpoint.

In the resulting solution, each memory has a corresponding cluster, and accordingly, IO logic can be configured as is done in an FPGA. Note that in some cases, some memory may be left unused. Even IO logic can be mapped to unused memory, as IO logic has truth tables.

Thus, one or more embodiments provide techniques to map a truth table describing a certain function to a set of TCAMs (and optionally, other types of memories), under configuration constraints. The memories, in at least some cases, are pre-fabricated. This provides important capabilities in memory-based computing. Advantageously, one or more embodiments are able to handle any arbitrary function. Furthermore, one or more embodiments partition a given function so that it can fit into prefabricated memory element(s) while minimizing total memory requirements.

Given the discussion thus far, it will be appreciated that, in general terms, an exemplary prefabricated programmable memory array 103, in accordance with an aspect of the invention, includes a plurality of ternary content-addressable memory modules 107, 109, 111; and at least one memory module 113, 115, 117 of a type other than ternary content-addressable memory. Also included are a plurality of input ports 209; a plurality of output ports 221; a reconfigurable input logic fabric 105; and a reconfigurable output logic fabric 119. The reconfigurable input logic fabric 105 is programmable to selectively interconnect the plurality of input ports with the plurality of ternary content-addressable memory modules and the at least one memory module of the type other than ternary content-addressable memory. The reconfigurable output logic fabric 119 is programmable to selectively interconnect the plurality of output ports with the plurality of ternary content-addressable memory modules and the at least one memory module of the type other than ternary content-addressable memory. Given the teachings herein, the skilled artisan will be able to adapt techniques used in field-programmable gate arrays (FPGAs) to implement the reconfigurable input logic fabric and reconfigurable output logic fabric. For example, a plurality of wires may be arranged in matrix form with switch boxes including programmable switches located at intersection points.

In some embodiments, the prefabricated programmable memory array further includes at least one additional memory module of a type other than ternary content-addressable memory, such that there are a plurality of memory modules of a type other than ternary content-addressable memory. The reconfigurable input logic fabric is programmable to selectively interconnect the plurality of input ports with the plurality of ternary content-addressable memory modules and the plurality of memory modules of a type other than ternary content-addressable memory and the reconfigurable output logic fabric is programmable to selectively interconnect the plurality of output ports with the plurality of ternary content-addressable memory modules and the plurality of memory modules of a type other than ternary content-addressable memory.

In some cases, the plurality of memory modules of the type other than ternary content-addressable memory include binary content-addressable memory modules 113.

In some cases, the plurality of memory modules of the type other than ternary content-addressable memory include static random access memory modules 115, 117.

In some embodiments, the plurality of memory modules of the type other than ternary content-addressable memory include at least one binary content-addressable memory module 113 and at least one static random access memory module 115, 117.

Furthermore, given the discussion thus far, it will be appreciated that an exemplary method, according to another aspect of the invention, includes the step of obtaining access to a truth table 403 having a plurality of rows. Each of the rows includes a plurality of input bits and a plurality of output bits, and at least some of the rows include don't-care inputs. Refer to FIG. 3, result of step 305. This step can be carried out, for example, with a suitable input-output module to read arrays or other data structures containing the truth table. See the discussion of the IC design process elsewhere herein. A further step includes clustering at least some of the rows into a plurality of multi-row clusters. Refer to FIG. 3 step 307. This step can be carried out, for example, with a clustering module including code that implements the steps described in the specification in connection with FIG. 6. An even further step includes assigning at least some of the multi-row clusters to ternary content-addressable memory modules of a prefabricated programmable memory array. Refer to FIG. 3 step 309. This step can be carried out, for example, with a mapping module including code that implements the steps described in the specification in connection with FIG. 7; e.g., code that implements mapping techniques—network flow or bipartite graph mapping are non-limiting examples. An even further step includes specifying in a data structure instructions for interconnecting the ternary content-addressable memory modules with a plurality of input pins of the prefabricated programmable memory array and a plurality of output pins of the prefabricated programmable memory array, in order to implement the truth table. Reference is made to FIG. 3 step 311. This step can be carried out, for example, with a hardware design language module. See the discussion of the IC design process elsewhere herein.

In some instances, the clustering is based upon configuration information 301 for the prefabricated programmable memory array 103. The prefabricated programmable memory array includes the ternary content-addressable memory modules 107, 109, 111, the plurality of input pins (see ports 209), the plurality of output pins (see ports 211), a reconfigurable input logic fabric 103, and a reconfigurable output logic fabric 119. The reconfigurable input logic fabric is programmable to selectively interconnect the plurality of input pins with the ternary content-addressable memory modules. The reconfigurable output logic fabric is programmable to selectively interconnect the plurality of output pins with the ternary content-addressable memory modules. The specifying step includes specifying settings for a plurality of programmable switches in the reconfigurable input logic fabric and the reconfigurable output logic fabric.

In some cases, a further step includes programming the reconfigurable input logic fabric and the reconfigurable output logic fabric by setting the plurality of programmable switches in the reconfigurable input logic fabric and the reconfigurable output logic fabric in accordance with the settings.

In some embodiments, with respect to the configuration information, the prefabricated programmable memory array further includes non-ternary content-addressable memory modules 113, 115, 117, a further steps include assigning at least some of the multi-row clusters to non-ternary content-addressable memory modules (see, e.g., FIG. 2 arrows from 205 to 215, 217); and interconnecting the non-ternary content-addressable memory modules with the plurality of input pins and the plurality of output pins to implement the truth table. In the regard, note that when referring to "the" or "the" plurality of input pins and "said" or "the" plurality of output pins, what is meant is the same overall group of pins; however, the TCAMS, SRAMS, and/or CAMS are not necessarily each connected to same pin(s) within the plurality.

In some cases, the clustering includes grouping together those of the rows having similar don't-care inputs and/or grouping together those of the rows having similar outputs. Refer to FIG. 4 and accompanying text. In some cases, similarity is with reference to a small Hamming distance. The Hamming distance has integer values, and what is "small" depends on the problem as will be appreciated by the skilled artisan given the teachings herein. A Hamming distance of one is small; however, if the original sequence is 100 digits then a Hamming distance of 2 or 3 or even more may also be "small." Hamming distance is cost on a graph edge—one or more embodiments cluster so as to minimize clustering cost. "Cost" in this context means that whenever nodes are merged, the edge distance is added to the cost. Thus, in one or more embodiments, group similar inputs and outputs using a cost minimization technique.

Referring to FIG. 6 and accompanying text, in some instances, the clustering includes representing each row of the truth table as a node in a graph, each of the nodes 601-615 having an input dependency pattern; interconnecting the nodes with a plurality of edges; assigning to each of the edges a cost; merging two of the nodes connected with a minimal-cost one of the edges; updating the edge costs and the input dependency patterns to reflect the merged nodes; and repeating the merging and updating steps until no further clustering is possible and all of the truth table fits on the prefabricated programmable memory array.

In some cases, if the truth table is too large then stop the process because it simply cannot fit.

Furthermore, referring for example to FIG. 7 and accompanying text, in some cases, the assigning includes applying at least one of network flow and bipartite graph matching, subject to placing cascaded ones of the clusters closely, placing the ternary content-addressable memory modules on a fastest available path between the input pins and the output pins, and placing those of the clusters with a higher input dependency on the fastest available path between the input pins and the output pins. Consider that in one or more embodiments, there will be a plurality of input pins and multiple TCAM modules with diverse spatial locations on the programmable fabric. Because of this some of the TCAM modules will be closer to the input pins than other TCAM modules. If one truth table needs 5 input pins and another needs 2 input pins, the former should be mapped to a TCAM closer to the input pins. A nested flow graph or bipartite graph matching can be utilized. Locate truth tables on the left side and TCAMS on the right side. Place arrows from each truth table to each TCAM and each arrow has an associated cost. Assign costs such that placing a truth table that only requires a few input pins to a TCAM close to the inputs will result in a higher cost and be discouraged. Find a minimum cost solution to assign truth tables to TCAMS.

It will be appreciated that one or more embodiments provide an apparatus including a memory, and at least one processor that is coupled to the memory and operative to perform exemplary method steps. Such apparatus operates on the fabric 103 as a workpiece and/or operates on a representation of at least a portion of the fabric 103 s a workpiece.

Exemplary Integrated Circuit and Design Structure Details

One or more exemplary methods as described herein can be used in the fabrication, testing, or operation of integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Figure 9:
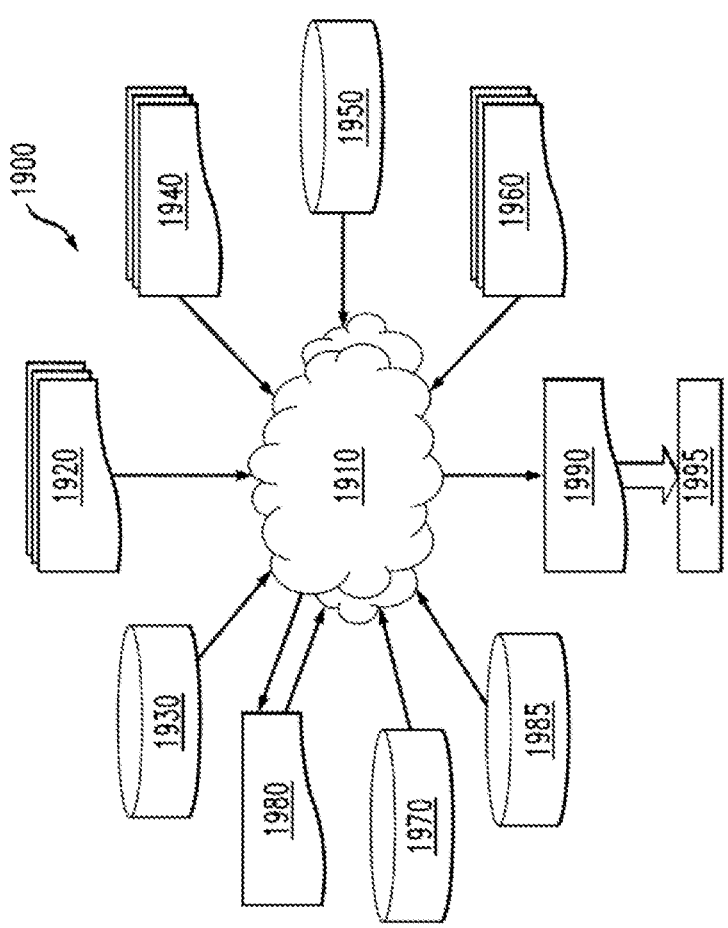
FIG. 9 is a flow diagram of a design process used in semiconductor design, manufacture, and/or test.

FIG. 9 shows a block diagram of an exemplary design flow 1900 used for example, in semiconductor IC logic design, simulation, test, layout, and manufacture. Design flow 1900 includes processes, machines and/or mechanisms for processing design structures or devices to generate logically or otherwise functionally equivalent representations of the design structures and/or devices described above and shown in FIGS. 1, 2, 4, 5, and 7. The design structures processed and/or generated by design flow 1900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1900 may vary depending on the type of representation being designed. For example, a design flow 1900 for building an application specific IC (ASIC) may differ from a design flow 1900 for designing a standard component or from a design flow 1900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 1920 that is preferably processed by a design process 1910. Design structure 1920 may be a logical simulation design structure generated and processed by design process 1910 to produce a logically equivalent functional representation of a hardware device. Design structure 1920 may also or alternatively comprise data and/or program instructions that when processed by design process 1910, generate a functional representation of the physical structure of a hardware device. Whether representing functional and/or structural design features, design structure 1920 may be generated using electronic computer-aided design (ECAD) such as implemented by a core developer/designer. When encoded on a machine-readable data transmission, gate array, or storage medium, design structure 1920 may be accessed and processed by one or more hardware and/or software modules within design process 1910 to simulate or otherwise functionally represent an electronic component, circuit, electronic or logic module, apparatus, device, or system such as those shown in FIGS. 1, 2, 4, 5, and 7. As such, design structure 1920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1910 preferably employs and incorporates hardware and/or software modules for synthesizing, translating, or otherwise processing a design/simulation functional equivalent of the components, circuits, devices, or logic structures shown in FIGS. 1, 2, 4, 5, and 7 to generate a Netlist 1980 which may contain design structures such as design structure 1920. Netlist 1980 may comprise, for example, compiled or otherwise processed data structures representing a list of wires, discrete components, logic gates, control circuits, I/O devices, models, etc. that describes the connections to other elements and circuits in an integrated circuit design. Netlist 1980 may be synthesized using an iterative process in which netlist 1980 is resynthesized one or more times depending on design specifications and parameters for the device. As with other design structure types described herein, netlist 1980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1910 may include hardware and software modules for processing a variety of input data structure types including Netlist 1980. Such data structure types may reside, for example, within library elements 1930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1940, characterization data 1950, verification data 1960, design rules 1970, and test data files 1985 which may include input test patterns, output test results, and other testing information. Design process 1910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1910 without deviating from the scope and spirit of the invention. Design process 1910 may also include modules for performing standard circuit design processes such as timing analysis, verification, design rule checking, place and route operations, etc.

Design process 1910 employs and incorporates logic and physical design tools such as HDL compilers and simulation model build tools to process design structure 1920 together with some or all of the depicted supporting data structures along with any additional mechanical design or data (if applicable), to generate a second design structure 1990. Design structure 1990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1920, design structure 1990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 4, 5, and 7. In one embodiment, design structure 1990 may comprise a compiled, executable HDL simulation model that functionally simulates the devices shown in FIGS. 1, 2, 4, 5, and 7.

Design structure 1990 may also employ a data format used for the exchange of layout data of integrated circuits and/or symbolic data format (e.g. information stored in a GDSII (GDS2), GL1, OASIS, map files, or any other suitable format for storing such design data structures). Design structure 1990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 4, 5, and 7. Design structure 1990 may then proceed to a stage 1995 where, for example, design structure 1990: proceeds to tape-out, is released to manufacturing, is released to a mask house, is sent to another design house, is sent back to the customer, etc.

For the avoidance of doubt, a design structure as described herein can include, for example, a specification and/or simulation of fabric 103 and/or a specification for how to map a truth table onto such a fabric, including how to set programmable switches, such as those in input logic fabric 105 and/or output logic fabric 119.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 8:
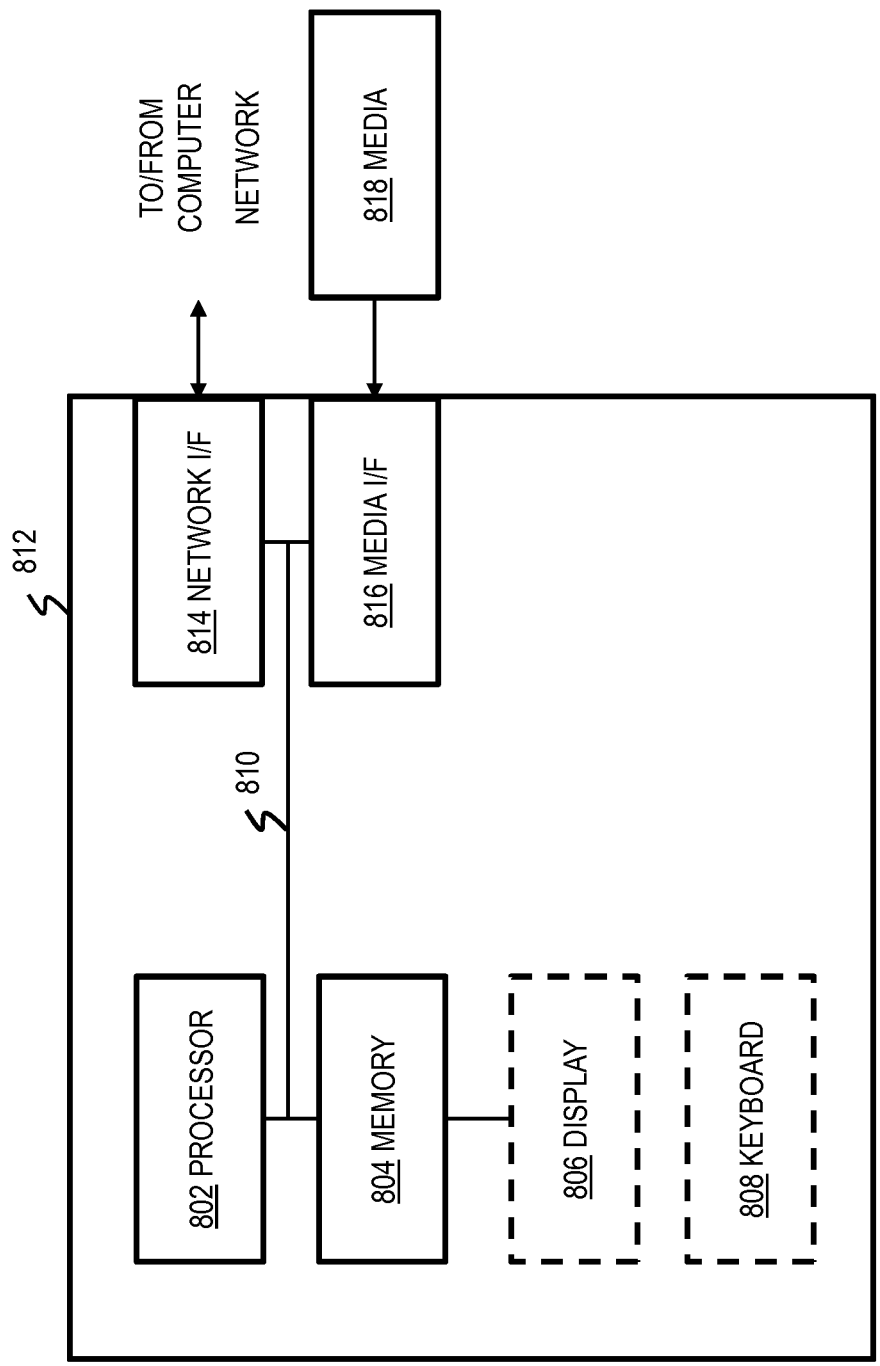
FIG. 8 depicts a computer system that may be useful in implementing one or more aspects and/or elements of the invention.

One or more embodiments can make use of software running on a general purpose computer or workstation. With reference to FIG. 8, such an implementation might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 802 coupled directly or indirectly to memory elements 804 through a system bus 810. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 812 as shown in FIG. 8) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 818 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, an input-output module, a clustering module, a mapping module, and a hardware design language module. The method steps can then be carried out using the distinct software modules and/or sub-modules of the system, as described above, executing on one or more hardware processors 802. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   obtaining access to a truth table having a plurality of rows, each of said rows comprising a plurality of input bits and a plurality of output bits, at least some of said rows comprising don't-care inputs;
   clustering at least some of said rows into a plurality of multi-row clusters;
   assigning at least some of said multi-row clusters to ternary content-addressable memory modules of a prefabricated programmable memory array; and
   specifying in a data structure instructions for interconnecting said ternary content-addressable memory modules with a plurality of input pins of said prefabricated programmable memory array and a plurality of output pins of said prefabricated programmable memory array, in order to implement said truth table.

2. The method of claim 1, wherein:
   said clustering is based upon configuration information for said prefabricated programmable memory array, said prefabricated programmable memory array comprising said ternary content-addressable memory modules, said plurality of input pins, said plurality of output pins, a reconfigurable input logic fabric, and a reconfigurable output logic fabric, said reconfigurable input logic fabric being programmable to selectively interconnect said plurality of input pins with said ternary content-addressable memory modules, said reconfigurable output logic fabric being programmable to selectively interconnect said plurality of output pins with said ternary content-addressable memory modules; and said specifying step comprises specifying settings for a plurality of programmable switches in said reconfigurable input logic fabric and said reconfigurable output logic fabric.

3. The method of claim 2, further comprising programming said reconfigurable input logic fabric and said reconfigurable output logic fabric by setting said plurality of programmable switches in said reconfigurable input logic fabric and said reconfigurable output logic fabric in accordance with said settings.

4. The method of claim 2, wherein, with respect to said configuration information, said prefabricated programmable memory array further comprises non-ternary content-addressable memory modules, further comprising:
assigning at least some of said multi-row clusters to non-ternary content-addressable memory modules; and
interconnecting said non-ternary content-addressable memory modules with said plurality of input pins and said plurality of output pins to implement said truth table.

5. The method of claim 4, wherein said clustering comprises grouping together those of said rows having similar don't-care inputs.

6. The method of claim 4, wherein said clustering comprises grouping together those of said rows having similar outputs.

7. The method of claim 4, wherein said clustering comprises:
representing each row of said truth table as a node in a graph, each of said nodes having an input dependency pattern;
interconnecting said nodes with a plurality of edges;
assigning to each of said edges a cost;
merging two of said nodes connected with a minimal-cost one of said edges;
updating said edge costs and said input dependency patterns to reflect said merged nodes; and
repeating said merging and updating steps until no further clustering is possible and all of said truth table fits on said prefabricated programmable memory array.

8. The method of claim 4 wherein said assigning comprises applying at least one of network flow and bipartite graph matching, subject to placing cascaded ones of said clusters closely, placing said ternary content-addressable memory modules on a fastest available path between said input pins and said output pins, and placing those of said clusters with a higher input dependency on said fastest available path between said input pins and said output pins.

9. The method of claim 4, further comprising providing a system, wherein the system comprises distinct software modules, each of the distinct software modules being embodied on a computer-readable storage medium, and wherein the distinct software modules comprise an input-output module, a clustering module, a mapping module, and a hardware design language module;
wherein:
said step of obtaining access to said truth table is carried out by said input-output module executing on at least one hardware processor;
said clustering step is carried out by said clustering module executing on said at least one hardware processor;
said assigning step is carried out by said mapping module executing on said at least one hardware processor; and
said specifying step is carried out by said hardware design language module executing on said at least one hardware processor.

10. An apparatus comprising:
a memory; and
at least one processor, coupled to said memory, and operative to:
obtain access to a truth table having a plurality of rows, each of the rows comprising a plurality of input bits and a plurality of output bits, at least some of the rows comprising don't-care inputs;
cluster at least some of the rows into a plurality of multi-row clusters;
assign at least some of the multi-row clusters to ternary content-addressable memory modules of a prefabricated programmable memory array; and
specify in a data structure in said memory instructions for interconnecting the ternary content-addressable memory modules with a plurality of input pins of the prefabricated programmable memory array and a plurality of output pins of the prefabricated programmable memory array, in order to implement the truth table.

11. The apparatus of claim 10, wherein the clustering is based upon configuration information for the prefabricated programmable memory array, the prefabricated programmable memory array comprising the ternary content-addressable memory modules, the plurality of input pins, the plurality of output pins, a reconfigurable input logic fabric, and a reconfigurable output logic fabric, the reconfigurable input logic fabric being programmable to selectively interconnect the plurality of input pins with the ternary content-addressable memory modules, the reconfigurable output logic fabric being programmable to selectively interconnect the plurality of output pins with the ternary content-addressable memory modules;
wherein said at least one processor is further operative to specify by specifying settings for a plurality of programmable switches in the reconfigurable input logic fabric and the reconfigurable output logic fabric.

12. The apparatus of claim 11, wherein said at least one processor is operative to cluster by:
representing each row of the truth table as a node in a graph, each of the nodes having an input dependency pattern;
interconnecting the nodes with a plurality of edges;
assigning to each of the edges a cost;
merging two of the nodes connected with a minimal-cost one of the edges;
updating the edge costs and the input dependency patterns to reflect the merged nodes; and
repeating the merging and updating until no further clustering is possible and all of the truth table fits on the prefabricated programmable memory array.

13. The apparatus of claim 12 wherein said at least one processor is operative to assign by applying at least one of network flow and bipartite graph matching, subject to placing cascaded ones of the clusters closely, placing the ternary content-addressable memory modules on a fastest available path between the input pins and the output pins, and placing those of the clusters with a higher input dependency on the fastest available path between said input pins and said output pins.

14. The apparatus of claim 10, further comprising a plurality of distinct software modules, each of said distinct software modules being embodied on a computer-readable storage medium, and wherein said distinct software modules comprise an input-output module, a clustering module, a mapping module, and a hardware design language module;

wherein:

said at least one processor is operative to obtain access to fastest available path truth table by executing said input-output module;

said at least one processor is operative to cluster by executing said clustering module;

said at least one processor is operative to assign by executing said mapping module; and said at least one processor is operative to specify by executing said hardware design language module.

* * * * *